US012575370B2

(12) United States Patent
Matsuura et al.

(10) Patent No.: US 12,575,370 B2
(45) Date of Patent: Mar. 10, 2026

(54) METAL FOIL WITH CARRIER AND USE METHOD AND MANUFACTURING METHOD THEREFOR

(71) Applicant: MITSUI MINING & SMELTING CO., LTD., Tokyo (JP)

(72) Inventors: Yoshinori Matsuura, Ageo (JP); Toshimi Nakamura, Ageo (JP)

(73) Assignee: MITSUI KINZOKU COMPANY, LIMITED, Tokyo (JP)

( * ) Notice: Subject to any disclaimer, the term of this patent is extended or adjusted under 35 U.S.C. 154(b) by 972 days.

(21) Appl. No.: 17/612,041

(22) PCT Filed: May 18, 2020

(86) PCT No.: PCT/JP2020/019685
§ 371 (c)(1),
(2) Date: Nov. 17, 2021

(87) PCT Pub. No.: WO2020/235537
PCT Pub. Date: Nov. 26, 2020

(65) Prior Publication Data
US 2022/0223456 A1      Jul. 14, 2022

(30) Foreign Application Priority Data

May 20, 2019     (JP) ................................. 2019-094333

(51) Int. Cl.
*G03F 1/38*           (2012.01)
*H01L 21/48*          (2006.01)
*H01L 21/683*         (2006.01)

(52) U.S. Cl.
CPC ...... *H01L 21/6835* (2013.01); *H01L 21/4807* (2013.01); *H01L 21/481* (2013.01); *H01L 21/4857* (2013.01)

(58) Field of Classification Search
CPC .......... G03F 1/38; G03F 7/0035; G03F 7/202; G03F 7/2037; G03F 7/105
See application file for complete search history.

(56) References Cited

U.S. PATENT DOCUMENTS

| | | | |
|---|---|---|---|
| 6,040,093 | A | 3/2000 | Yuzawa |
| 2010/0078213 | A1 | 4/2010 | Furutan et al. |

(Continued)

FOREIGN PATENT DOCUMENTS

| | | |
|---|---|---|
| JP | 9-74062 | 3/1997 |
| JP | 2005-101137 | 4/2005 |

(Continued)

*Primary Examiner* — Daborah Chacko-Davis
(74) *Attorney, Agent, or Firm* — GREENBLUM & BERNSTEIN, P.L.C.

(57) ABSTRACT

Provided is a carrier-attached metal foil with which both exposure for rough circuits and exposure for fine circuits in wiring formation can be performed based on the same alignment marks, and as a result, rough circuits and fine circuits can be simultaneously formed in a one-stage circuit formation process. This carrier-attached metal foil is a carrier-attached metal foil including a carrier, a release layer provided on at least one surface of the carrier, and a metal layer provided on the release layer, wherein the carrier-attached metal foil includes: a wiring region throughout which the carrier, the release layer, and the metal layer are present; and at least two positioning regions provided on the at least one surface of the carrier-attached metal foil and forming alignment marks used for positioning in wiring formation involving exposure and development.

13 Claims, 4 Drawing Sheets

(56)             References Cited

U.S. PATENT DOCUMENTS

| | | | |
|---|---|---|---|
| 2013/0037838 A1* | 2/2013 | Speier | H01L 22/10 |
| | | | 118/620 |
| 2018/0255649 A1 | 9/2018 | Tay et al. | |
| 2019/0013212 A1 | 1/2019 | Matsuura | |
| 2019/0029125 A1 | 1/2019 | Matsuura | |

FOREIGN PATENT DOCUMENTS

| | | |
|---|---|---|
| JP | 2011-119501 | 6/2011 |
| JP | 2013-251314 | 12/2013 |
| JP | 2015-35551 | 2/2015 |
| TW | 200931490 | 7/2009 |
| WO | 97/50121 | 12/1997 |
| WO | 2017/150283 | 9/2017 |
| WO | 2017/150284 | 9/2017 |

* cited by examiner

METAL FOIL WITH CARRIER AND USE METHOD AND MANUFACTURING METHOD THEREFOR

TECHNICAL FIELD

The present invention relates to a carrier-attached metal foil and methods for using and manufacturing the same.

BACKGROUND ART

In recent years, the multilayering of printed wiring boards has been widely performed in order to increase the mounting density of the printed wiring boards for size reduction. Such multilayer printed wiring boards are utilized in many portable electronic apparatuses for the purpose of weight reduction and size reduction. Further reduction of the thicknesses of interlayer insulating layers, and still further weight reduction as wiring boards are required of these multilayer printed wiring boards.

As a technique for satisfying such requirements, a method for manufacturing a multilayer printed wiring board using a coreless build-up method is adopted. The coreless build-up method is a method of alternately laminating (building up) insulating layers and wiring layers for multilayering, without using a so-called core substrate. For the coreless build-up method, it is proposed to use a carrier-attached copper foil for easy release between a support and a multilayer printed wiring board. For example, Patent Literature 1 (JP2005-101137A) discloses a method for manufacturing a package substrate for semiconductor device mounting, comprising affixing an insulating resin layer to the carrier surface of a carrier-attached copper foil to form a support, forming a first wiring conductor on the superthin copper layer side of the carrier-attached copper foil by steps such as photoresist processing, pattern electrolytic copper plating, and resist removal, then forming build-up wiring layers, releasing the carrier-attached supporting substrate, and removing the superthin copper layer.

For the fining of embedded circuits as shown in Patent Literature 1, a carrier-attached copper foil in which the thickness of a superthin copper layer is 1 μm or less is desired. Accordingly, it is proposed to form a superthin copper layer by a vapor phase method such as sputtering in order to achieve the reduction of the thickness of the superthin copper layer. For example, Patent Literature 2 (WO2017/150283) discloses a carrier-attached copper foil in which a release layer, an antireflection layer, and a superthin copper layer are formed on a carrier such as glass or ceramic by sputtering. Patent Literature 3 (WO2017/150284) discloses a carrier-attached copper foil in which intermediate layers (for example, an adhesion metal layer and a release-assisting layer), a release layer, and a superthin copper layer (for example, a film thickness of 300 nm) are formed on a carrier such as glass or ceramic by sputtering. Patent Literatures 2 and 3 also teach that intermediate layers composed of predetermined metals are interposed, and thus excellent stability of the mechanical release strength of the carrier is provided, and that the antireflection layer exhibits a desirable dark color, and thus visibility in image inspection (for example, automatic image inspection (AOI)) is improved.

Especially, with still further size reduction and power saving of electronic devices, the need for the high integration and thinning of semiconductor chips and printed wiring boards increases. As next-generation packaging techniques for satisfying such a need, the adoption of FO-WLP (Fan-Out Wafer Level Packaging) and PLP (Panel Level Packaging) has been studied in recent years. Also in FO-WLP and PLP, the adoption of the coreless build-up method is studied. One such method is a method referred to as an RDL-First (Redistribution Layer-First) method in which a wiring layer, and build-up wiring layers as needed, are formed on a coreless support surface, and further the support is released as needed, and then chips are mounted. For example, Patent Literature 4 (JP2015-35551A) discloses a method for manufacturing a semiconductor apparatus, comprising the formation of a metal release layer on a major surface of a support composed of glass or a silicon wafer, the formation of an insulating resin layer on the metal release layer, the formation of a Redistribution Layer comprising build-up layers on the insulating resin layer, the mounting and sealing of semiconductor integrated circuits on the Redistribution Layer, the exposure of the release layer by the removal of the support, the exposure of secondary mounting pads by the removal of the release layer, and the formation of solder bumps on the surfaces of the secondary mounting pads, and secondary mounting.

Meanwhile, a technique of performing positioning based on alignment marks prior to exposure is known in the case where a circuit pattern is transferred onto a semiconductor wafer by exposure. For example, Patent Literature 5 (JPH9-74062A) discloses a semiconductor exposure method comprising the steps of: forming a pattern showing crystal orientation on a semiconductor wafer; detecting the pattern; positioning the wafer at a predetermined exposure position based on the detection result; and transferring the first circuit pattern onto the positioned wafer by exposure. According to Patent Literature 5, it is stated that by performing transfer by exposure by such a method, exposure can be performed at an accurate position with respect to crystal orientation, and exposure can be performed at the same position even by different apparatuses.

CITATION LIST

Patent Literature

Patent Literature 1: JP2005-101137A
Patent Literature 2: WO2017/150283
Patent Literature 3: WO2017/150284
Patent Literature 4: JP2015-35551A
Patent Literature 5: JPH9-74062A

SUMMARY OF INVENTION

With further size and weight reduction of electronic apparatuses in recent years, it has been desired that a redistribution layer has a wiring pattern in which the line/space (L/S) is extremely highly fine (for example, L/S=2 μm/2 μm). In order to meet such a requirement, the following is considered: forming a redistribution layer by a method such as the above-described build-up method on a glass carrier-attached copper foil (or a ceramic carrier-attached copper foil) comprising a superthin copper layer whose thickness is reduced, as shown in Patent Literatures 2 and 3. On the other hand, in a photolithography process, the exposure resolution and exposure area of an exposure apparatus are generally in a trade-off relationship, and therefore an exposure apparatus for fine circuit formation excellent in exposure resolution generally has a narrow exposure area (for example, 70 mm square). Therefore, a two-stage circuit formation process can be adopted in which exposure and development for forming rough circuits are performed, and then exposure and development for forming fine circuits are performed anew. In other words, first, in order to form a rough design necessary for chip mounting, rough circuits (for example, rough circuits with L/S=10 μm/10 μm) are formed through exposure using an exposure apparatus having a wide exposure area (for example, 250 mm square) but poor in exposure resolution, and subsequent development (first-stage circuit formation). Then, fine circuits are formed through exposure using an exposure apparatus for fine circuit formation, and subsequent development (second-stage circuit formation). However, in such a two-stage circuit formation method, the process is complicated, and moreover, since rough circuits are formed first, high positioning accuracy is necessary in order to further form fine circuits, easily causing a decrease in yield. As described above, the positioning technique using a pattern showing crystal orientation formed on a semiconductor (Si) wafer is known (see Patent Literature 5), but in the first place, a carrier-attached copper foil is not a single crystal like a semiconductor (Si) wafer, and therefore forming a pattern showing crystal orientation itself is impossible, and alignment marks suitable for carrier-attached metal foils are desired.

The present inventors have now found that by providing processed portions constituting alignment marks on a carrier itself forming a carrier-attached metal foil, both exposure for rough circuits and exposure for fine circuits in wiring formation can be performed based on the same alignment marks, and as a result, rough circuits and fine circuits can be simultaneously formed in a one-stage circuit formation process.

Therefore, an object of the present invention is to provide a carrier-attached metal foil with which both exposure for rough circuits and exposure for fine circuits in wiring formation can be performed based on the same alignment marks, and as a result, rough circuits and fine circuits can be simultaneously formed in a one-stage circuit formation process.

According to an aspect of the present invention, there is provided a carrier-attached metal foil comprising a carrier, a release layer provided on at least one surface of the carrier, and a metal layer provided on the release layer, wherein the carrier-attached metal foil comprises:

a wiring region throughout which the carrier, the release layer, and the metal layer are present; and at least two positioning regions provided on the at least one surface of the carrier-attached metal foil, the positioning regions forming alignment marks used for positioning in wiring formation involving exposure and development.

According to another aspect of the present invention, there is provided a method for forming wiring through exposure and development using the carrier-attached metal foil, comprising the step of performing positioning based on the positioning regions of the carrier-attached metal foil prior to exposure, wherein exposures for circuits having different circuit widths are separately performed, and development for the circuits is simultaneously performed.

According to another aspect of the present invention, there is provided a method for manufacturing the carrier-attached metal foil, comprising the steps of:

providing a carrier;

processing predetermined regions of at least one surface of the carrier to form at least two processed portions constituting the alignment marks, thereby defining at least two positioning regions; and forming the release layer and the metal layer in sequence on the at least one surface of the carrier.

DESCRIPTION OF EMBODIMENTS

Carrier-Attached Metal Foil

Figure 1:
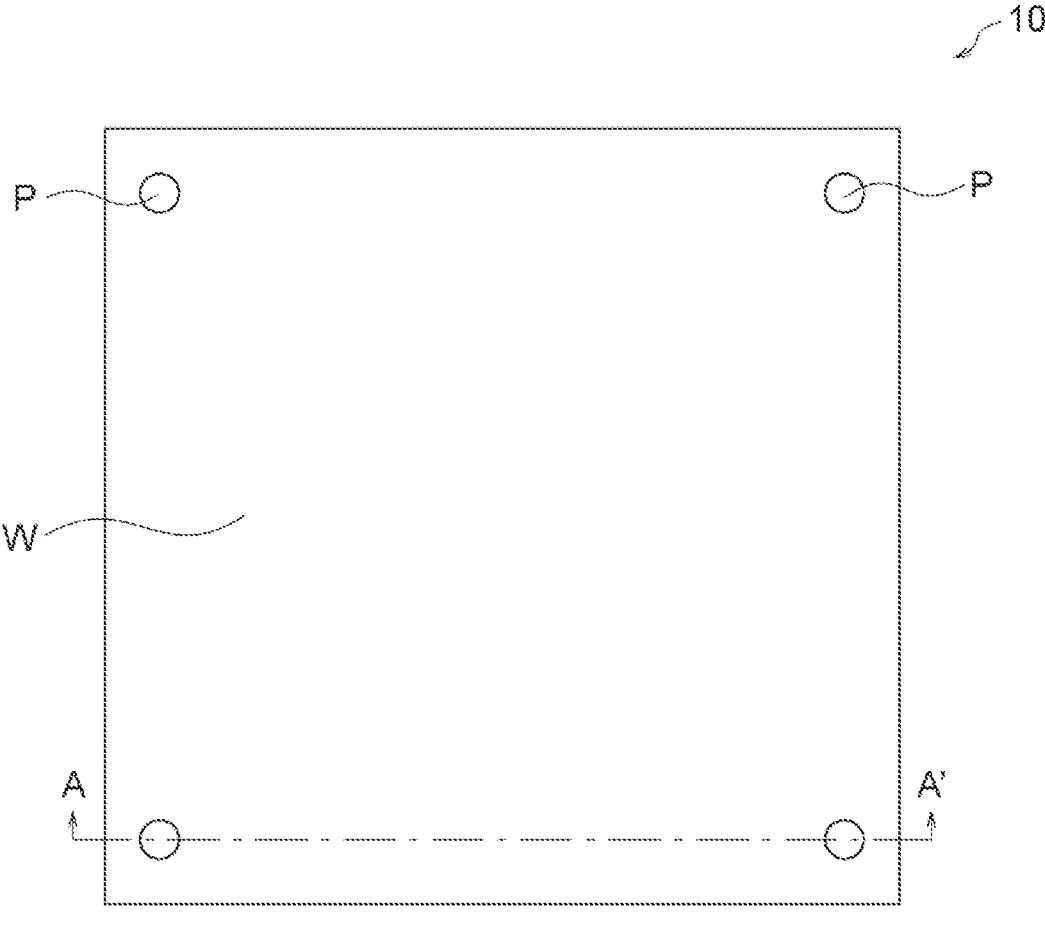
FIG. 1 is a top schematic view showing one aspect of the carrier-attached metal foil of the present invention.
Figure 2:
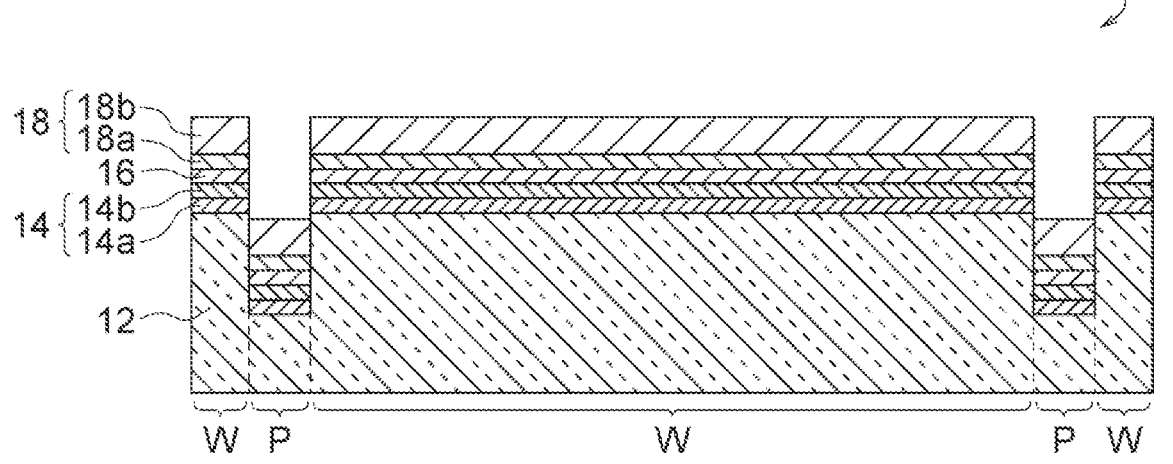
FIG. 2 is a cross-sectional schematic view showing one example of the layer configuration of the carrier-attached metal foil shown in FIG. 1 in a cross section taken along line A-A'.
Figures 3, 4, 5:
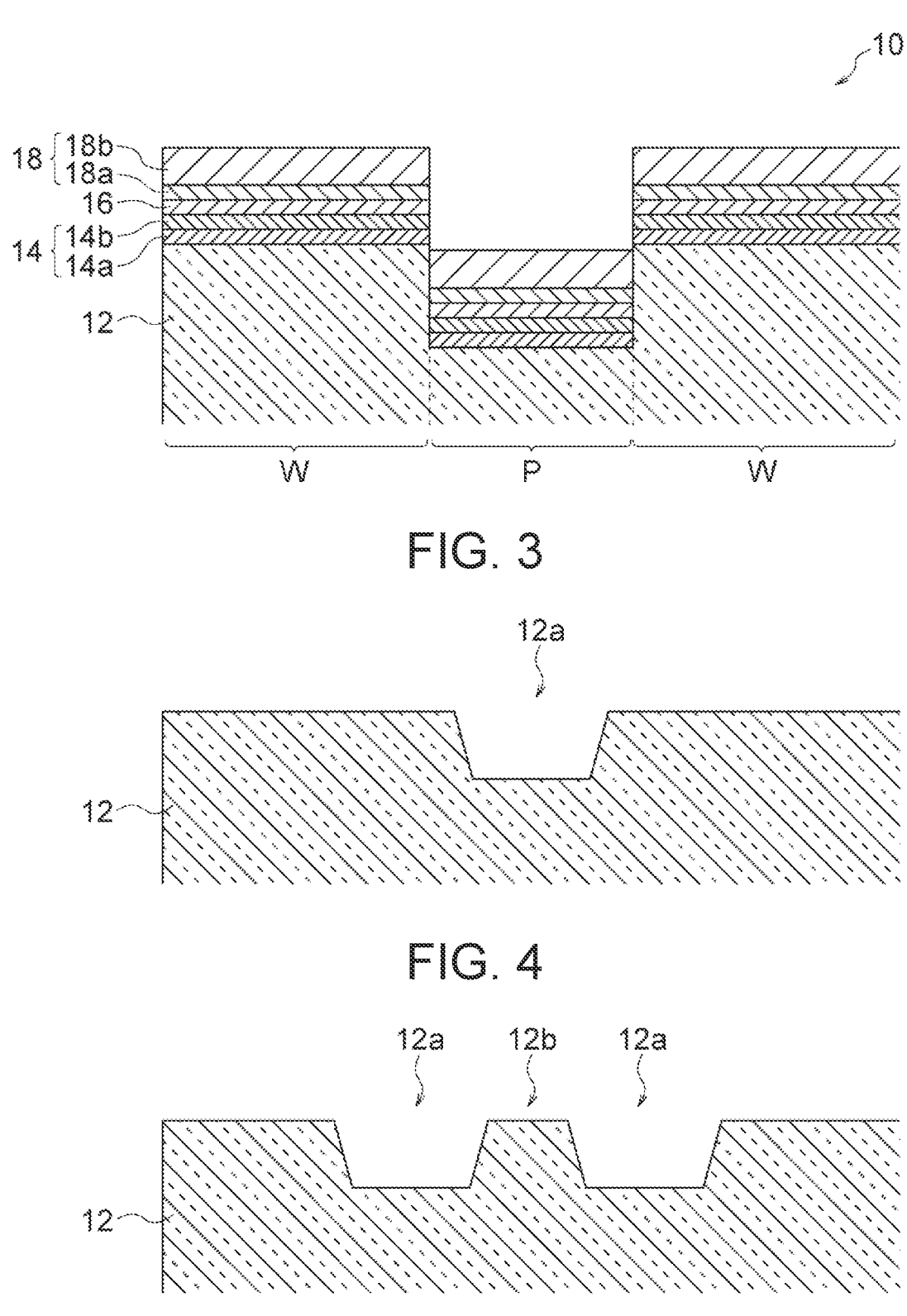
FIG. 3 is an enlarged view of a positioning region in the carrier-attached metal foil shown in FIG. 2.
FIG. 4 is an enlarged view of a processed portion constituting an alignment mark provided on a carrier and is a view when the processed portion is a depressed portion.
FIG. 5 is an enlarged view of a processed portion constituting an alignment mark provided on a carrier and is a view when the processed portion comprises a depressed portion and a raised portion surrounded by the depressed portion.

One example of the carrier-attached metal foil of the present invention is schematically shown in FIGS. 1 and 2. As shown in FIGS. 1 and 2, a carrier-attached metal foil 10 comprises a carrier 12, a release layer 16, and a metal layer 18 in this order. The carrier 12 is composed of, for example, glass or ceramic. The release layer 16 is provided on at least one surface of the carrier 12. The metal layer 18 is provided on the release layer 16. The carrier-attached metal foil 10 may further have an intermediate layer 14 between the carrier 12 and the release layer 16 as desired. Each of the intermediate layer 14, the release layer 16, and the metal layer 18 may be a single layer composed of one layer or a multilayer composed of two or more layers. The carrier-attached metal foil 10 may comprise the various layers in order on both surfaces of the carrier 12 so as to be vertically symmetrical. The carrier-attached metal foil 10 of the present invention has a wiring region W and at least two positioning regions P as shown in FIGS. 2 and 3. The wiring region W is a region for wiring throughout which the carrier 12, the release layer 16, and the metal layer 18 are present. On the other hand, the positioning region P is a region forming an alignment mark used for positioning in wiring formation involving exposure and development. The positioning region P is defined by a processed portion provided on the at least one surface (that is, the surface on the side on which the release layer 16 and the metal layer 18 are provided) of the carrier 12. In other words, the wiring region W is a region used for the formation of wiring, whereas the positioning region P is a region that is a reference where positioning is performed prior to exposure. In the positioning region P, the various layers may be present throughout or in part of it or may not be present at all. In the carrier-attached metal foil 10, a region other than the wiring region W and the positioning region P (that is, a region not used for the formation of wiring and a reference for positioning) may be present, and for example, a region having high release strength between the carrier and the metal layer or a region in which no release occurs between the carrier and the metal layer described later may be present. By providing processed portions constituting alignment marks on the carrier 12 itself in the carrier-attached metal foil 10 in this manner, both exposure for rough circuits and exposure for fine circuits in wiring formation can be performed based on the same alignment marks, and as a result, both rough circuits and fine circuits can be simultaneously formed in a one-stage circuit formation process (that is, rough circuits and fine circuits can be simultaneously developed).

In the present invention, wiring formation typically refers to the formation of a redistribution layer, and the redistribution layer means a layer comprising an insulating layer and a wiring layer formed in the interior and/or on the surface of the insulating layer. For example, chip electrodes disposed on a semiconductor chip and terminals disposed on a printed wiring board at a greater pitch than the chip electrodes can be electrically connected via this redistribution layer. A preferred method for forming a redistribution layer using the carrier-attached metal foil of the present invention will be described later. A rough circuit means a circuit having a circuit width of greater than 5 μm and 500 μm or less. The rough circuit itself may constitute a redistribution layer or may be a circuit for use for the formation of a redistribution layer (so-called dummy circuit). On the other hand, a fine circuit means a circuit having a circuit width of 0.1 μm or more and 5 μm or less.

The number of alignment marks of the carrier-attached metal foil 10 (in other words, the number of the positioning regions P spaced apart from each other) is preferably 2 or more and 200 or less, more preferably 4 or more and 100 or less, and further preferably 6 or more and 50 or less. In a redistribution layer area, generally, a plurality of polygonal (typically quadrangular) fine circuit assembly regions in which fine circuits assemble are formed apart from each other, and the number of alignment marks is preferably two times or more and eight times or less, further preferably three times or more and six times or less, the number of fine circuit assembly regions. Thus, positioning by an exposure apparatus can be performed with higher accuracy during the formation of a redistribution layer while the manufacturing efficiency of the carrier-attached metal foil 10 is kept high. Examples of a preferred shape (planar view shape) of the alignment mark include a circle, a cross, polygons (for example, a rectangle), and combinations thereof, and particularly preferably a circle. Positioning by an exposure apparatus is generally performed through detecting the edges of the alignment marks and identifying the positions of the central points of the alignment marks. When the alignment marks are circular, errors when the central points are identified can be reduced to perform positioning with still higher accuracy.

The alignment mark preferably has a depressed portion 12a provided on the carrier 12. In other words, as shown in FIG. 4, the processed portion constituting the alignment mark itself may be the depressed portion 12a. Thus, the contrast or color difference between the depressed portion 12a and its surroundings is emphasized, and as a result, the visibility of the edge of the alignment mark (that is, the edge of the depressed portion 12a) improves, and positioning can be performed with still higher accuracy. Alternatively, the alignment mark also preferably has a raised portion 12b provided on the carrier 12. In other words, as shown in FIG. 5, the processed portion constituting the alignment mark may comprise a depressed portion 12a and a raised portion 12b surrounded by the depressed portion 12a. Thus, the contrast or color difference between the raised portion 12b and its surroundings (that is, the depressed portion 12a) is emphasized, and as a result, the visibility of the edge of the raised portion 12b in the alignment mark improves, and positioning can be performed with still higher accuracy.

Figure 6:
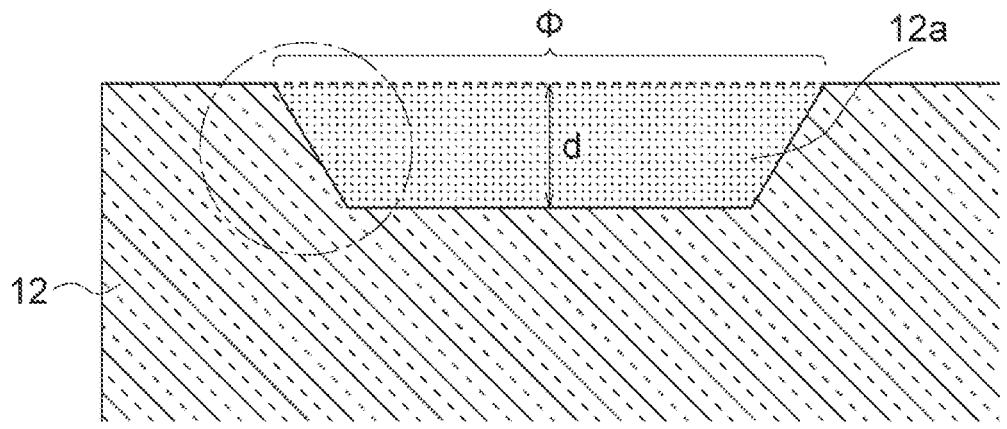
FIG. 6 is a view for explaining the maximum depth d and outer diameter φ of the depressed portion shown in FIGS. 4 and 5.

As shown in FIG. 6, the maximum depth d of the depressed portion 12a is preferably 0.1 μm or more and 1000 μm or less, more preferably 0.5 μm or more and 800 μm or less, further preferably 1.0 μm or more and 500 μm or less, and particularly preferably 3.0 μm or more and 400 μm or less. When the maximum depth is within such a range, a decrease in the mechanical strength of the carrier is suppressed, and the deformation and cracking of the carrier during the manufacturing process can be effectively prevented, and even after the various layers are laminated on the carrier, the processed portion constituting the alignment mark is not buried, and an alignment mark having substantially the same shape as the processed portion is formed, and sufficient visibility can be ensured, and therefore the positioning accuracy during exposure can be still further improved. From the same viewpoint, the planar view shape of the depressed portion 12a is a circle, and its outer diameter φ is preferably 50 μm or more and 5000 μm or less, more preferably 70 μm or more and 3000 μm or less, further preferably 80 μm or more and 1000 μm or less, and particularly preferably 100 μm or more and 500 μm or less.

Figure 7:
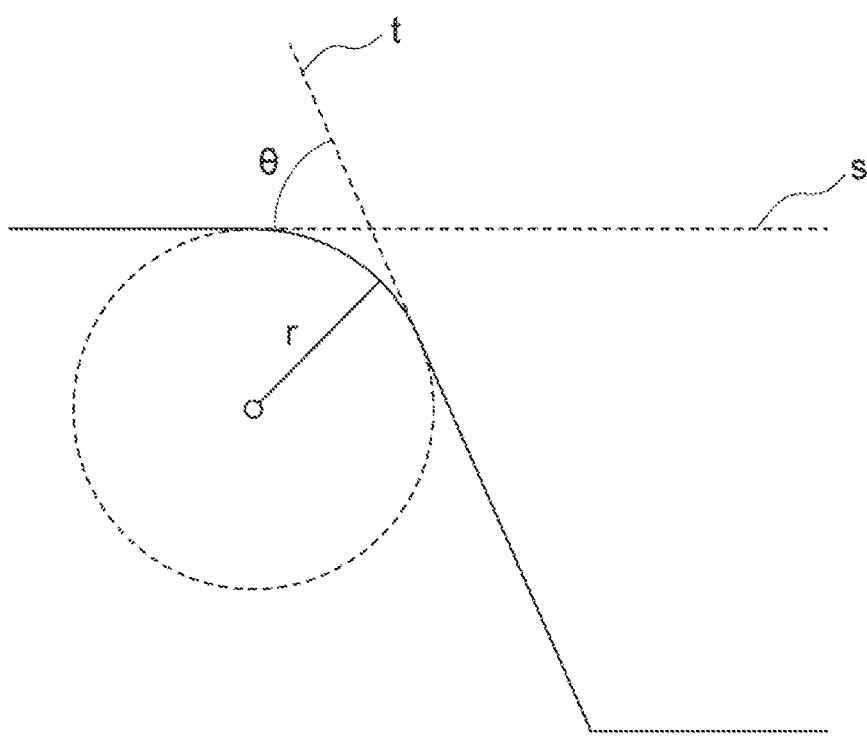
FIG. 7 is an enlarged view of the portion surrounded by the dotted line in FIG. 6 and is a view for explaining an angle θ and a radius of curvature r.

From the viewpoint of still further improving the visibility of the alignment mark, as shown in FIG. 7, the angle θ formed by the major surface s of the carrier 12 and the tangent t to the inner wall surface of the depressed portion 12a is preferably 40° or more and 130° or less. The lower limit value of the angle θ is more preferably 60° or more, further preferably 80° or more. The upper limit value of the angle θ is not particularly limited, but from the viewpoint of easily performing processing, typically the angle θ is 130° or less, preferably 110° or less. Similarly, from the viewpoint of still further improving the visibility of the alignment mark, as shown in FIG. 7, the open end of the depressed portion 12a is round, and the radius of curvature r of this round open end is preferably 100 μm or less, more preferably 50 μm or less, and further preferably 20 μm or less. The lower limit value of the radius of curvature r is not particularly limited, but typically the radius of curvature r is 0.1 μm or more.

The carrier 12 is preferably composed of glass or ceramic. A glass carrier or a ceramic carrier has high dimensional stability unlike a resin carrier or the like, and therefore even when heat treatment or the like is performed, the mispositioning of alignment marks can be effectively reduced, and therefore positioning can be performed with high accuracy. The form of the carrier 12 may be any of a sheet, a film, and a plate. The carrier 12 may be a laminate of these sheets, films, plates, and the like. For example, the carrier 12 is preferably one that can function as a support having rigidity, such as a glass plate or a ceramic plate. Preferred examples of the ceramic constituting the carrier 12 include alumina, zirconia, silicon nitride, aluminum nitride, and various other fine ceramics. More preferably, from the viewpoint of preventing the warpage of the carrier-attached metal foil 10 in a process involving heating, the carrier 12 is a material having a coefficient of thermal expansion (CTE) of less than 25 ppm/K (typically 1.0 ppm/K or more and 23 ppm/K or less). Examples of such a material include ceramics and glass as described above. From the viewpoint of handleability and ensuring flatness during chip mounting, the carrier 12 preferably has a Vickers hardness of 100 HV or more, more preferably 150 HV or more and 2500 HV or less. As a material satisfying these characteristics, the carrier 12 is particularly preferably composed of glass. When glass is used as the carrier 12, advantages are that it is lightweight, has a low coefficient of thermal expansion, has high insulating properties, and is rigid and has a flat surface and therefore the surface of the metal layer 18 can be extremely smoothed. In addition, when the carrier 12 is glass, advantages are that it has surface flatness (coplanarity) advantageous for fine circuit formation, that it has chemical resistance in desmear and various plating steps in a wiring manufacturing process, and that a chemical separation method can be adopted when the carrier is released from the carrier-attached metal foil. Preferred examples of the glass constituting the carrier 12 include quartz glass, borosilicate glass, alkali-free glass, soda lime glass, aluminosilicate glass, and combinations thereof, more preferably alkali-free glass, soda lime glass, and combinations thereof, and particularly preferably alkali-free glass. The alkali-free glass is glass containing substantially no alkali metals that comprises silicon dioxide, aluminum oxide, boron oxide, and alkaline earth metal oxides such as calcium oxide and barium oxide as main components and further contains boric acid. An advantage of this alkali-free glass is that it has a low coefficient of thermal expansion in the range of 3 ppm/K or more and 5 ppm/K or less and is stable in a wide temperature zone of 0° C. to 350° C., and therefore the warpage of the glass in a process involving heating can be minimized. The thickness of the carrier 12 is preferably 100 μm or more and 2000 μm or less, more preferably 300 μm or more and 1800 μm or less, and further preferably 400 μm or more and 1100 μm or less. When the thickness is within such a range, the thinning of wiring, and the reduction of warpage that occurs during electronic component mounting can be achieved while suitable strength that does not hinder handling is ensured.

The surface of the carrier 12 on the side adjacent to the release layer 16 (the side adjacent to the intermediate layer 14 when it is present) preferably has an arithmetic mean roughness Ra of 0.1 nm or more and 70 nm or less, more preferably 0.5 nm or more and 60 nm or less, further preferably 1.0 nm or more and 50 nm or less, particularly preferably 1.5 nm or more and 40 nm or less, and most preferably 2.0 nm or more and 30 nm or less as measured in accordance with JIS B 0601-2001 using a laser microscope. The arithmetic mean roughness of the carrier 12 surface smaller in this manner can provide desirably lower arithmetic mean roughness Ra on the surface of the metal layer 18 opposite to the release layer 16 (the outside surface of the metal layer 18) and thus is suitable for forming a highly fine wiring pattern (for example, the line/space (L/S) is 0.1 μm/0.1 μm to 5 μm/5 μm) in wiring formed using the metal layer 18 on the wiring region W.

The intermediate layer 14 provided as desired may have a one-layer configuration or a configuration of two or more layers. When the intermediate layer 14 is composed of two or more layers, the intermediate layer 14 comprises a first intermediate layer 14a provided directly on the carrier 12, and a second intermediate layer 14b provided adjacent to the release layer 16. The first intermediate layer 14a is preferably a layer composed of at least one metal selected from the group consisting of Ti, Cr, Al, and Ni, in terms of ensuring adhesion to the carrier 12. The first intermediate layer 14a may be a pure metal or an alloy. The thickness of the first intermediate layer 14a is preferably 5 nm or more and 500 nm or less, more preferably 10 nm or more and 300 nm or less, further preferably 18 nm or more and 200 nm or less, and particularly preferably 20 nm or more and 100 nm or less. The second intermediate layer 14b is preferably a layer composed of Cu, in terms of controlling the release strength between the second intermediate layer 14b and the release layer 16 at the desired value. The thickness of the second intermediate layer 14b is preferably 5 nm or more and 500 nm or less, more preferably 10 nm or more and 400 nm or less, further preferably 15 nm or more and 300 nm or less, and particularly preferably 20 nm or more and 200 nm or less. Another interposed layer may be present between the first intermediate layer 14a and the second intermediate layer 14b, and examples of the constituent material of the interposed layer include alloys of at least one metal selected from the group consisting of Ti, Cr, Mo, Mn, W, and Ni, and Cu. On the other hand, when the intermediate layer 14 has a one-layer configuration, the first intermediate layer 14a may be adopted as the intermediate layer as it is, or the first intermediate layer 14a and the second intermediate layer 14b may be replaced by one intermediate alloy layer. This intermediate alloy layer is preferably composed of a copper alloy in which the content of at least one metal selected from the group consisting of Ti, Cr, Mo, Mn, W, Al, and Ni is 1.0 at % or more, and the Cu content is 30 at % or more. The thickness of the intermediate alloy layer is preferably 5 nm or more and 500 nm or less, more preferably 10 nm or more and 400 nm or less, further preferably 15 nm or more and 300 nm or less, and particularly preferably 20 nm or more and 200 nm or less. The thicknesses of layers described above are values measured by analyzing a layer cross section by a transmission electron microscope-energy dispersive X-ray spectrometer (TEM-EDX). The metal constituting the intermediate layer 14 may comprise unavoidable impurities due to the raw material component, the film formation step, and the like. In the case of exposure to the air after the film formation of the intermediate layer 14, the presence of oxygen mixed due to the exposure is allowed, which is not particularly limited. The intermediate layer 14 may be manufactured by any method but is particularly preferably a layer formed by a magnetron sputtering method using a metal target, in terms of being able to improve the uniformity of film thickness distribution.

The release layer 16 is a layer that allows or facilitates the release of the carrier 12, and the intermediate layer 14 when it is present. The release layer 16 may be either of an organic release layer and an inorganic release layer. Examples of the organic component used for the organic release layer include nitrogen-containing organic compounds, sulfur-containing organic compounds, and carboxylic acids. Examples of the nitrogen-containing organic compounds include triazole compounds and imidazole compounds. On the other hand, examples of the inorganic component used for the inorganic release layer include metal oxides of at least one or more of Cu, Ti, Al, Nb, Zr, Cr, W, Ta, Co, Ag, Ni, In, Sn, Zn, Ga, and Mo, and carbon. Among these, the release layer 16 is preferably a layer mainly comprising carbon, in terms of ease of release, film-forming properties, and the like, more preferably a layer mainly composed of carbon or a hydrocarbon, and further preferably a layer composed of amorphous carbon, a hard carbon film. In this case, the release layer 16 (that is, a carbon layer) preferably has a carbon concentration of 60 atomic % or more, more preferably 70 atomic % or more, further preferably 80 atomic % or more, and particularly preferably 85 atomic % or more as measured by XPS. The upper limit value of the carbon concentration is not particularly limited and may be 100 atomic % but is practically 98 atomic % or less. The release layer 16 (especially a carbon layer) can comprise unavoidable impurities (for example, oxygen, carbon, and hydrogen derived from the surrounding environment such as an atmosphere). In the release layer 16 (especially a carbon layer), metal atoms can be mixed due to the film formation method of the metal layer 18 or the like laminated later. Carbon has low interdiffusivity and low reactivity with the carrier, and even if the carrier-attached metal foil 10 is subjected to pressing at a temperature of more than 300° C., the formation of metallic bonds between the metal layer and the bonding interface due to high temperature heating can be prevented to maintain a state in which the release and removal of the carrier is easy. The release layer 16 is preferably a layer formed by a vapor phase method such as sputtering, in terms of suppressing excessive impurities in the amorphous carbon, and in terms of the continuous productivity of other layers, and the like. The thickness of the release layer 16 (especially a carbon layer) is preferably 1 nm or more and 20 nm or less, more preferably 1 nm or more and 10 nm or less. This thickness is a value measured by analyzing a layer cross section by a transmission electron microscope-energy dispersive X-ray spectrometer (TEM-EDX).

The release layer 16 may comprise a metal oxide layer and a carbon layer or be a layer comprising a metal oxide and carbon. Particularly, when the carrier-attached metal foil 10 comprises the intermediate layer 14, the carbon layer can contribute to the stable release of the carrier 12, and the metal oxide layer can suppress the diffusion of the metal elements derived from the intermediate layer 14 and the metal layer 18, accompanying heating. As a result, even after the carrier-attached metal foil 10 is heated at a temperature as high as, for example, 350° C. or more, stable releasability can be maintained. The metal oxide layer is preferably a layer comprising an oxide of metals composed of Cu, Ti, Al, Nb, Zr, Cr, W, Ta, Co, Ag, Ni, In, Sn, Zn, Ga, Mo, and combinations thereof. The metal oxide layer is particularly preferably a layer formed by a reactive sputtering method in which sputtering is performed under an oxidizing atmosphere, using a metal target, in terms of being able to easily control film thickness by the adjustment of film formation time. The thickness of the metal oxide layer is preferably 0.1 nm or more and 100 nm or less. The upper limit value of the thickness of the metal oxide layer is more preferably 60 nm or less, further preferably 30 nm or less, and particularly preferably 10 nm or less. This thickness is a value measured by analyzing a layer cross section by a transmission electron microscope-energy dispersive X-ray spectrometer (TEM-EDX). The order in which the metal oxide layer and the carbon layer are laminated is not particularly limited. The release layer 16 may be present in a state of a mixed phase in which the boundary between the metal oxide layer and the carbon layer is not clearly identified (that is, a layer comprising a metal oxide and carbon).

Similarly, from the viewpoint of maintaining stable releasability even after heat treatment at high temperature, the release layer 16 may be a metal-containing layer in which the surface on the side adjacent to the metal layer 18 is a fluorination-treated surface and/or a nitriding-treated surface. In the metal-containing layer, a region in which the sum of the content of fluorine and the content of nitrogen is 1.0 atomic % or more (hereinafter referred to as a "(F+N) region") is preferably present over a thickness of 10 nm or more, and the (F+N) region is preferably present on the metal layer 18 side of the metal-containing layer. The thickness (in terms of $SiO_2$) of the (F+N) region is a value specified by performing the depth profile elemental analysis of the carrier-attached metal foil 10 using XPS. The fluorination-treated surface or the nitriding-treated surface can be preferably formed by Reactive ion etching (RIE) or a reactive sputtering method. On the other hand, the metal element included in the metal-containing layer preferably has a negative standard electrode potential. Preferred examples of the metal element included in the metal-containing layer include Cu, Ag, Sn, Zn, Ti, Al, Nb, Zr, W, Ta, Mo, and combinations thereof (for example, alloys and intermetallic compounds). The content of the metal element in the metal-containing layer is preferably 50 atomic % or more and 100 atomic % or less. The metal-containing layer may be a single layer composed of one layer or a multilayer composed of two or more layers. The thickness of the entire metal-containing layer is preferably 10 nm or more and 1000 nm or less, more preferably 30 nm or more and 500 nm or less, further preferably 50 nm or more and 400 nm or less, and particularly preferably 100 nm or more and 300 nm or less. The thickness of the metal-containing layer itself is a value measured by analyzing a layer cross section by a transmission electron microscope-energy dispersive X-ray spectrometer (TEM-EDX).

The metal layer 18 is a layer composed of a metal. The metal layer 18 may have a one-layer configuration or a configuration of two or more layers. When the metal layer 18 is composed of two or more layers, the metal layer 18 can have a configuration in which metal layers, a first metal layer 18a to an m-th metal layer (m is an integer of 2 or more), are laminated in order on the surface side of the release layer 16 opposite to the carrier 12. The thickness of the entire metal layer 18 is preferably 1 nm or more and 2000 nm or less, preferably 100 nm or more and 1500 nm or less, more preferably 200 nm or more and 1000 nm or less, further preferably 300 nm or more and 800 nm or less, and particularly preferably 350 nm or more and 500 nm or less. The thickness of the metal layer 18 is a value measured by analyzing a layer cross section by a transmission electron microscope-energy dispersive X-ray spectrometer (TEM-EDX). An example in which the metal layer 18 is composed of two layers, a first metal layer 18a and a second metal layer 18b, will be described below.

The first metal layer 18a preferably provides the desired functions such as an etching stopper function and an anti-reflection function to the carrier-attached metal foil 10. Preferred examples of the metal constituting the first metal layer 18a include Ti, Al, Nb, Zr, Cr, W, Ta, Co, Ag, Ni, Mo, and combinations thereof, more preferably Ti, Zr, Al, Cr, W, Ni, Mo, and combinations thereof, further preferably Ti, Al, Cr, Ni, Mo, and combinations thereof, and particularly preferably Ti, Mo, and combinations thereof. These elements have the property of not dissolving in flash etchants (for example, copper flash etchants) and, as a result, can exhibit excellent chemical resistance to flash etchants. Therefore, the first metal layer 18a is a layer less likely to be etched with a flash etchant than the second metal layer 18b described later, and therefore can function as an etching stopper layer. In addition, the metal constituting the first metal layer 18a also has the function of preventing the reflection of light, and therefore the first metal layer 18a can also function as an antireflection layer for improving visibility in image inspection (for example, automatic image inspection (AOI)). The first metal layer 18a may be a pure metal or an alloy. The metal constituting the first metal layer 18a may comprise unavoidable impurities due to the raw material component, the film formation step, and the like. The upper limit of the content of the metal is not particularly limited and may be 100 atomic %. The first metal layer 18a is preferably a layer formed by a physical vapor deposition (PVD) method, more preferably a layer formed by sputtering. The thickness of the first metal layer 18a is preferably 1 nm or more and 500 nm or less, more preferably 10 nm or more and 400 nm or less, further preferably 30 nm or more and 300 nm or less, and particularly preferably 50 nm or more and 200 nm or less.

Preferred examples of the metal constituting the second metal layer 18b include the transition elements of groups 4, 5, 6, 9, 10, and 11, Al, and combinations thereof (for example, alloys and intermetallic compounds), more preferably the transition elements of groups 4 and 11, Al, Nb, Co, Ni, Mo, and combinations thereof, further preferably the transition elements of group 11, Ti, Al, Mo, and combinations thereof, particularly preferably Cu, Ti, Mo, and combinations thereof, and most preferably Cu. The second metal layer 18b may be manufactured by any method and may be a metal foil formed, for example, by wet film formation methods such as an electroless metal plating method and an electrolytic metal plating method, physical vapor deposition (PVD) methods such as sputtering and vacuum deposition, chemical vapor film formation, or combinations thereof. A particularly preferred second metal layer 18b is a metal layer formed by physical vapor deposition (PVD) methods such as a sputtering method and vacuum deposition, most preferably a metal layer manufactured by a sputtering method, from the viewpoint of being easily adapted to a fine pitch due to super-thinning. The second metal layer 18b is preferably a non-roughened metal layer. On the other hand, when the carrier-attached metal foil 10 is used for the manufacture of a printed wiring board, the second metal layer 18b may be one in which secondary roughening occurs by preliminary roughening, soft etching treatment, rinse treatment, or oxidation-reduction treatment, as long as wiring pattern formation during printed wiring board manufacture is not hindered. From the viewpoint of being adapted to a fine pitch as described above, the thickness of the second metal layer 18b is preferably 10 nm or more and 1000 nm or less, more preferably 20 nm or more and 900 nm or less, further preferably 30 nm or more and 700 nm or less, still more preferably 50 nm or more and 600 nm or less, particularly preferably 70 nm or more and 500 nm or less, and most preferably 100 nm or more and 400 nm or less. The metal layer having a thickness within such a range is preferably manufactured by a sputtering method from the viewpoint of the in-plane uniformity of film formation thickness, and productivity in a sheet form or a roll form.

The surface of the second metal layer 18b opposite to the first metal layer 18a (the outside surface of the metal layer 18) preferably has an arithmetic mean roughness Ra of 1.0 nm or more and 100 nm or less, more preferably 2.0 nm or more and 40 nm or less, further preferably 3.0 nm or more and 35 nm or less, particularly preferably 4.0 nm or more and 30 nm or less, and most preferably 5.0 nm or more and 15 nm or less as measured in accordance with JIS B 0601-2001. Arithmetic mean roughness smaller in this manner can be suitable for forming a highly fine wiring pattern (for example, the line/space (L/S) is 0.1 μm/0.1 μm to 5 μm/5 μm), for example, in wiring formed using the wiring region W of the metal layer 18.

When the metal layer 18 has a one-layer configuration, the second metal layer 18b is preferably adopted as the metal layer 18 as it is. On the other hand, when the metal layer 18 has an m-layer (m is an integer of 3 or more) configuration, the first metal layer 18a to (m−1)th metal layer of the metal layer 18 preferably have the configuration of the first metal layer 18a, and the outermost layer, that is, the m-th metal layer, of the metal layer 18 preferably has the configuration of the second metal layer 18b.

Onto the carrier-attached metal foil 10, a region in which the metal layer 18 is less likely to be released from the carrier 12 in a cutting place may be provided as a cutting margin. In other words, when chips or the like are mounted after wiring is formed on the carrier-attached metal foil 10, the carrier-attached metal foil 10 is cut and downsized to, for example, about several tens of mm square to several hundreds of mm square so as to have a size that can be treated by mounting equipment. In this respect, the release strength of the release layer 16 exposed at the cutting interface of the carrier-attached metal foil 10 is low, and therefore the metal layer 18 may be released from the carrier 12 due to the load during the cutting or after the cutting. Therefore, by providing a region having high release strength between the carrier and the metal layer (for example, a region having a release strength of 30 gf/cm or more and 3000 gf/cm or less as measured in accordance with JIS Z 0237-2009) or a region in which no release occurs between the carrier and the metal layer (for example, a region in which the release layer is not present) on the carrier-attached metal foil as a cutting margin, undesirable release of the metal layer 18 from the cutting surface can be effectively prevented. The region having high release strength can be formed, for example, by performing roughening treatment or the like on an essentially flat carrier 12 surface to form an uneven region having a maximum height Rz of 1.0 μm or more and 30.0 μm or less as measured in accordance with JIS B 0601-2001 in a predetermined pattern form (for example, a lattice form, a fence form, or a cross form), and then laminating the various layers. When such roughening treatment is performed together with the formation of the processed portions constituting the alignment marks on a carrier 12 surface, the manufacturing efficiency improves. On the other hand, the region in which no release occurs can be formed, for example, by (i) forming the various layers with a frame formed in a predetermined pattern form disposed in a state of being floated from a carrier 12 surface. Alternatively, the region in which no release occurs can also be formed by (ii) forming the various layers on the carrier 12 to obtain a temporary carrier-attached metal foil, and then performing heating on this temporary glass carrier-attached metal foil in a predetermined pattern form by a method such as laser irradiation.

The thickness of the entire carrier-attached metal foil 10 is not particularly limited but is preferably 500 μm or more and 3000 μm or less, more preferably 700 μm or more and 2500 μm or less, further preferably 900 μm or more and 2000 μm or less, and particularly preferably 1000 μm or more and 1700 μm or less. The size of the carrier-attached metal foil 10 is not particularly limited but is preferably 10 cm square or more, more preferably 20 cm square or more, and further preferably 25 cm square or more. The upper limit of the size of the carrier-attached metal foil 10 is not particularly limited, and an example of one rough standard of the upper limit includes 1000 cm square. The carrier-attached metal foil 10 is in a form in which the carrier-attached metal foil 10 itself can be handled alone, before and after the formation of wiring.

Method for Manufacturing Carrier-Attached Metal Foil

The carrier-attached metal foil 10 of the present invention can be manufactured by (1) providing a carrier, (2) processing predetermined regions of the carrier to form alignment marks, and (3) forming various layers such as a release layer and a metal layer on the carrier.

(1) Provision of Carrier

First, the carrier 12 is provided. The carrier 12 is preferably composed of glass or ceramic. Generally, glass products and ceramic products are excellent in flatness, and therefore the surface on the wiring region W of the metal layer 18 laminated on the carrier 12 via the release layer 16 also has a flat shape, and the flat surface of the metal layer 18 on the wiring region W allows the formation of fine circuits. Preferred materials and characteristics of the carrier 12 are as described above. In the following description, the formation of processed portions constituting alignment marks and the film formation of various layers are performed only on one surface of the carrier 12, but it is needless to say that when a double-sided carrier-attached metal foil is manufactured, the same operations may also be performed on the other surface of the carrier 12 to perform the formation of processed portions constituting alignment marks and the film formation of various layers.

(2) Formation of Processed Portions Constituting Alignment Marks

Next, predetermined regions of a surface of the carrier 12 are processed to form at least two processed portions constituting alignment marks, thereby defining at least two positioning regions P. Examples of preferred processing methods include an etching method, a blasting method, a laser ablation method, and combinations thereof, and more preferably a blasting method, a laser ablation method, and combinations thereof from the viewpoint of improving throughput. Particularly, processed portions constituting alignment marks are preferably formed using a blasting method, and thus processing soil (for example, the deterioration of the carrier and the scattering of foreign matter due to processing) can be still further reduced. Processing by blasting treatment can be performed by projecting a particulate medium (projection material) onto predetermined regions (that is, regions in which processed portions constituting alignment marks are to be formed) of a carrier 12 surface from a nozzle. A preferred discharge diameter of the nozzle is 0.1 mm or more and 10.0 mm or less, more preferably 0.2 mm or more and 8.5 mm or less. The particle diameter of the medium is preferably 1.0 µm or more and 1000 µm or less, more preferably 10.0 µm or more and 800 µm or less, and the amount projected is preferably 10 g/minute or more and 3000 g/minute or less, more preferably 20 g/minute or more and 2000 g/minute or less. A preferred medium discharge pressure is 0.01 MPa or more and 1.0 MPa or less, more preferably 0.05 MPa or more and 0.8 MPa or less. Preferred examples of the material of the medium include alumina, zirconia, silicon carbide, iron, aluminum, zinc, glass, steel, green carbonite, and boron carbide. The Mohs hardness of the medium is preferably 4 or more, more preferably 5.5 or more, and further preferably 6.0 or more. Preferred examples of processing by etching treatment include a wet process using a solution comprising hydrofluoric acid, and a dry process by Reactive ion etching (RIE) using a process gas comprising fluorine (for example, $CF_4$ or $SF_6$). On the other hand, processing by laser ablation treatment can be performed using, for example, a YAG laser beam, a YLF laser beam, a $YVO_4$ laser beam, a carbon dioxide laser beam, a CW (continuous wave) laser beam, and a solid-state UV laser beam. The processing conditions are not particularly limited, and known conditions may be adopted as they are, or known conditions may be appropriately changed according to the material of the carrier 12.

In order to selectively perform processing (especially blasting treatment or etching treatment) on the desired regions, masking is preferably used. Specifically, a masking layer is preferably formed on portions other than the predetermined regions (that is, regions in which processed portions constituting alignment marks are to be formed) of the surface of the carrier 12 before the processing. In this case, it is desired that the masking layer is removed after the processing.

(3) Film Formation of Various Layers on Carrier

The intermediate layer 14 (for example, the first intermediate layer 14a and the second intermediate layer 14b) as desired, the release layer 16, and the metal layer 18 (for example, the first metal layer 18a and the second metal layer 18b) are formed on the surface of the carrier 12 on the side on which the processed portions constituting the alignment marks are formed, and thus the wiring region W is formed. The film formation of each layer of the intermediate layer 14 (when present), the release layer 16, and the metal layer 18 is preferably performed by a physical vapor deposition (PVD) method from the viewpoint of being easily adapted to a fine pitch due to super-thinning. Examples of the physical vapor deposition (PVD) method include a sputtering method, a vacuum deposition method, and an ion plating method, and most preferably a sputtering method in terms of being able to control film thickness in a wide range such as 0.05 nm to 5000 nm, and in terms of being able to ensure film thickness uniformity over a wide width or area, and the like. Particularly, by forming all layers of the intermediate layer 14 (when present), the release layer 16, and the metal layer 18 by the sputtering method, the manufacturing efficiency increases significantly. The film formation by the physical vapor deposition (PVD) method should be performed according to known conditions using a known vapor phase film formation apparatus, and is not particularly limited. For example, when the sputtering method is adopted, the sputtering method may include various known methods such as magnetron sputtering, a bipolar sputtering method, and a facing target sputtering method, but magnetron sputtering is preferred in terms of a fast film formation rate and high productivity. The sputtering may be performed with either of DC (direct current) and RF (radio frequency) power supplies. Also for the target shape, a widely known plate type target can be used, but a cylindrical target is desirably used from the viewpoint of target use efficiency. The film formation of each layer of the intermediate layer 14 (when present), the release layer 16, and the metal layer 18 by a physical vapor deposition (PVD) method (preferably a sputtering method) will be described below. In the following description, in the carrier-attached metal foil 10, the intermediate layer 14 is composed of the first intermediate layer 14a and the second intermediate layer 14b, the release layer 16 is a carbon layer, and the metal layer 18 is composed of the first metal layer 18a and the second metal layer 18b.

The film formation of the first intermediate layer 14a by a physical vapor deposition (PVD) method (preferably a sputtering method) is preferably performed by magnetron sputtering under a non-oxidizing atmosphere using a target composed of at least one metal selected from the group consisting of Ti, Cr, Al, and Ni, in terms of being able to improve film thickness distribution uniformity. The purity of the target is preferably 99.9 wt % or more. As the gas used for sputtering, an inert gas such as argon gas is preferably used. The flow rate of argon gas should be appropriately determined according to the sputtering chamber size and the film formation conditions and is not particularly limited. From the viewpoint of continuously performing film formation without poor operation such as abnormal discharge and poor plasma irradiation, the pressure during the film formation is preferably in the range of 0.1 Pa or more and 20 Pa or less. This pressure range should be set by adjusting the film formation power and the flow rate of argon gas according to the apparatus structure, the capacity, the exhaust capacity of the vacuum pump, the rated capacity of the film formation power supply, and the like. The sputtering power should be appropriately set within the range of 0.05 W/cm² or more and 10.0 W/cm² or less per unit area of the target considering the film thickness uniformity of the film formation, productivity, and the like.

The film formation of the second intermediate layer 14b by a physical vapor deposition (PVD) method (preferably a sputtering method) is preferably performed by magnetron sputtering under a non-oxidizing atmosphere using a copper target, in terms of being able to improve film thickness distribution uniformity. The purity of the copper target is preferably 99.9 wt % or more. As the gas used for sputtering, an inert gas such as argon gas is preferably used. The flow rate of argon gas should be appropriately determined according to the sputtering chamber size and the film formation conditions and is not particularly limited. From the viewpoint of continuously performing film formation without poor operation such as abnormal discharge and poor plasma irradiation, the pressure during the film formation is preferably in the range of 0.1 Pa or more and 20 Pa or less. This pressure range should be set by adjusting the film formation power and the flow rate of argon gas according to the apparatus structure, the capacity, the exhaust capacity of the vacuum pump, the rated capacity of the film formation power supply, and the like. The sputtering power should be appropriately set within the range of 0.05 W/cm² or more and 10.0 W/cm² or less per unit area of the target considering the film thickness uniformity of the film formation, productivity, and the like.

The film formation of the release layer 16 by a physical vapor deposition (PVD) method (preferably a sputtering method) is preferably performed under an inert atmosphere such as argon using a carbon target. The carbon target is preferably composed of graphite but can comprise unavoidable impurities (for example, oxygen and carbon derived from the surrounding environment such as an atmosphere). The purity of the carbon target is preferably 99.99 wt % or more, more preferably 99.999 wt % or more. From the viewpoint of continuously performing film formation without poor operation such as abnormal discharge and poor plasma irradiation, the pressure during the film formation is preferably in the range of 0.1 Pa or more and 20 Pa or less. This pressure range should be set by adjusting the film formation power and the flow rate of argon gas according to the apparatus structure, the capacity, the exhaust capacity of the vacuum pump, the rated capacity of the film formation power supply, and the like. The sputtering power should be appropriately set within the range of 0.05 W/cm² or more and 10.0 W/cm² or less per unit area of the target considering the film thickness uniformity of the film formation, productivity, and the like.

The film formation of the first metal layer 18a by a physical vapor deposition (PVD) method (preferably a sputtering method) is preferably performed by a magnetron sputtering method using a target composed of at least one metal selected from the group consisting of Ti, Al, Nb, Zr, Cr, W, Ta, Co, Ag, Ni, and Mo. The purity of the target is preferably 99.9% or more. Particularly, the film formation of the first metal layer 18a by a magnetron sputtering method is preferably performed under an inert gas atmosphere such as argon at a pressure of 0.1 Pa or more and 20 Pa or less. The sputtering pressure is more preferably 0.2 Pa or more and 15 Pa or less, further preferably 0.3 Pa or more and 10

Pa or less. The control of the pressure range should be performed by adjusting the film formation power and the flow rate of argon gas according to the apparatus structure, the capacity, the exhaust capacity of the vacuum pump, the rated capacity of the film formation power supply, and the like. The flow rate of argon gas should be appropriately determined according to the sputtering chamber size and the film formation conditions and is not particularly limited. The sputtering power should be appropriately set within the range of 1.0 W/cm² or more and 15.0 W/cm² or less per unit area of the target considering the film thickness uniformity of the film formation, productivity, and the like. The carrier temperature is preferably kept constant during the film formation in terms of easily obtaining stable film characteristics (for example, film resistance and crystal size). The carrier temperature during the film formation is preferably adjusted within the range of 25° C. or more and 300° C. or less, more preferably 40° C. or more and 200° C. or less, and further preferably 50° C. or more and 150° C. or less.

The film formation of the second metal layer 18b by a physical vapor deposition (PVD) method (preferably a sputtering method) is preferably performed under an inert atmosphere such as argon using a target composed of at least one metal selected from the group consisting of Cu, Au, Ti, Al, Nb, Zr, Cr, W, Ta, Co, Ag, Ni, and Mo. The metal target such as a copper target is preferably composed of a metal such as metal copper but can comprise unavoidable impurities. The purity of the metal target is preferably 99.9% or more, more preferably 99.99%, and further preferably 99.999% or more. In order to avoid temperature increase during the vapor phase film formation of the second metal layer 18b, the cooling mechanism of the stage may be provided in sputtering. From the viewpoint of stably performing film formation without poor operation such as abnormal discharge and poor plasma irradiation, the pressure during the film formation is preferably in the range of 0.1 Pa or more and 20 Pa or less. This pressure range should be set by adjusting the film formation power and the flow rate of argon gas according to the apparatus structure, the capacity, the exhaust capacity of the vacuum pump, the rated capacity of the film formation power supply, and the like. The sputtering power should be appropriately set within the range of 0.05 W/cm² or more and 10.0 W/cm² or less per unit area of the target considering the film thickness uniformity of the film formation, productivity, and the like.

Method for Using Carrier-Attached Metal Foil (Method for Forming Wiring)

Wiring (for example, a redistribution layer) can be formed using the carrier-attached metal foil 10 of the present invention. In other words, according to a preferred aspect of the present invention, a method for forming wiring through exposure and development using the carrier-attached metal foil 10 is provided. This method comprises the step of performing positioning based on the positioning regions P of the carrier-attached metal foil 10 prior to exposure. In this method, exposure for a plurality of circuits having different circuit widths (preferably having fine circuits and rough circuits) is separately performed, and development for the plurality of circuits is simultaneously performed. One example of a preferred method for forming a redistribution layer using the carrier-attached metal foil 10 of the present invention will be described below. This method comprises (1) laminating a photoresist on the carrier-attached metal foil, (2) performing exposure for rough circuits after first positioning, (3) performing exposure for fine circuits after second positioning, (4) performing development to form a resist pattern, and then (5) performing circuit formation.

(1) Lamination of Photoresist

Figure 8:
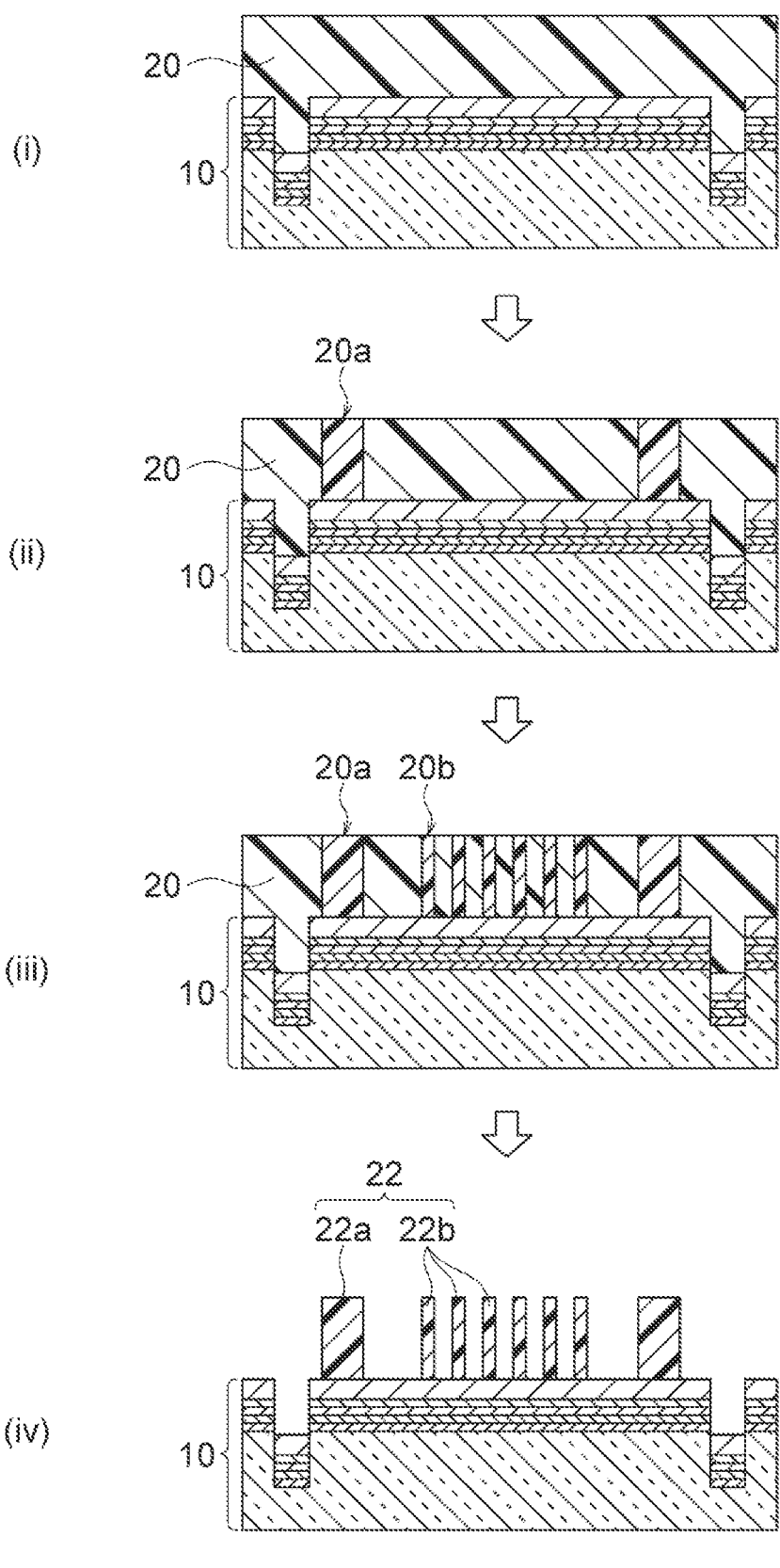
FIG. 8 is a process flow chart for explaining one example of a procedure for performing exposure and development on the carrier-attached metal foil of the present invention.

As shown in FIG. 8(*i*), a photoresist 20 is laminated on the surface of the metal layer 18 of the carrier-attached metal foil 10. For the photoresist 20, a known material generally used for the manufacture of a redistribution layer can be used. The photoresist 20 may be either of a negative type and a positive type and may be either of a film type and a liquid type. The photoresist 20 is preferably a photosensitive film, for example, a photosensitive dry film.

(2) Exposure for Rough Circuits

In order to form a rough design necessary for chip mounting, exposure for rough circuits is performed on the surface of the photoresist 20 on the wiring region W. Prior to the exposure for rough circuits, first positioning is performed based on the positioning regions P of the carrier-attached metal foil 10. Thus, as shown in FIG. 8(*ii*), exposed portions 20*a* for rough circuits are formed. The exposure for rough circuits is preferably performed using an exposure apparatus having a wide exposure area (for example, 250 mm square). Examples of the exposure method of the exposure apparatus include a stepper method and a Laser Direct Imaging (LDI) method, and preferably a stepper method from the viewpoint of exposure resolution. Examples of the photomask used for the exposure apparatus by the stepper method include a glass mask and a Cr mask, and from the viewpoint of performing exposure with high accuracy, a Cr mask is preferably used.

(3) Exposure for Fine Circuits

Then, exposure for fine circuits is performed on the surface of the photoresist 20 on the wiring region W. Prior to the exposure for fine circuits, second positioning is performed based on the positioning regions P of the carrier-attached metal foil 10. Thus, as shown in FIG. 8(*iii*), exposed portions 20*b* for fine circuits are formed. The exposure method of the exposure apparatus for fine circuits is preferably a stepper method, and the photomask used for the exposure apparatus by the stepper method is preferably a Cr mask. Here, an exposure apparatus having a wide exposure area used for exposure for rough circuits is generally poor in exposure resolution, and therefore it is generally difficult to perform exposure for rough circuits and exposure for fine circuits using the same exposure apparatus. In this respect, the positioning regions P are present on the carrier-attached metal foil 10 itself, and thus even when separate exposure apparatuses are used, positioning can be performed with high accuracy based on the same alignment marks. As a result, resist patterns for rough circuits and for fine circuits can be simultaneously formed by one development without undergoing two-stage exposure and development as in conventional cases. From the viewpoint, in the redistribution layer formed by the method of the present invention, R/F representing the ratio of the maximum circuit width of the rough circuits, R, to the minimum circuit width of the fine circuits, F, is preferably 2.0 or more and 500 or less, more preferably 5.0 or more and 300 or less, and further preferably 10 or more and 100 or less. It is needless to say that when exposure for rough circuits and exposure for fine circuits can be performed using the same exposure apparatus (for example, when the ratio R/F is small), exposure for rough circuits and for fine circuits may be performed using the same exposure apparatus.

(4) Formation of Resist Pattern

As shown in FIG. 8(*iv*), the development of the photoresist 20 is performed to form a resist pattern 22 composed of a rough circuit pattern 22*a* and a fine circuit pattern 22*b*. The development should be performed according to a known method and known conditions generally used for the manufacture of a redistribution layer using a commercially available developer or the like, and is not particularly limited. In this manner, in the preferred method for forming a redistribution layer using the carrier-attached metal foil of the present invention, exposure for fine circuits and exposure for rough circuits are separately performed, and development for fine circuits and rough circuits is simultaneously performed, and thus rough circuits and fine circuits can be simultaneously formed in a one-stage circuit formation process.

(5) Formation of Redistribution Layer

Electroplating (for example, electric copper plating) is applied between the resist pattern 22 portions, and then the resist pattern 22 is stripped, and the unnecessary portions (that is, portions not forming a wiring pattern) of the metal layer 18 exposed by the stripping of the resist pattern 22 are etched away to form a first wiring layer having rough circuits and fine circuits. Subsequently, an insulating layer and an nth wiring layer (n is an integer of 2 or more) are alternately formed on the surface of the carrier-attached metal foil 10 on which the first wiring layer is formed. Thus, it is possible to obtain a coreless support in which a redistribution layer, a layer comprising insulating layers and wiring layers formed in the interiors and/or on the surfaces of the insulating layers, is formed. The various operations in this step should be performed according to known methods and conditions generally used for the manufacture of a redistribution layer, and are not particularly limited.

After the formation of the redistribution layer, the step of mounting electronic devices such as chips on the redistribution layer may be performed to manufacture semiconductor packages. The carrier 12, the intermediate layer 14 (when present), and the release layer 16 may be removed by a known method. As described above, the process of forming a redistribution layer and then mounting chips in this manner is a method referred to as an RDL-First method. According to this method, the electrical inspection of a wiring layer and subsequently laminated build-up wiring layers on a coreless support surface can be performed before chips are mounted, and therefore chips can be mounted only on good product portions, avoiding the defective portions of the wiring layers. As a result, the RDL-First method is economically advantageous compared with a Chip-First method, a method of sequentially laminating wiring layers on the surfaces of chips, and the like, in terms of being able to avoid waste of chips. Examples of the electronic devices mounted on the redistribution layer assumed as an optional step include semiconductor devices, chip capacitors, and resistors. Examples of the electronic device mounting method include a flip chip mounting method and a die bonding method. The flip chip mounting method is a method of bonding the mounting pads of electronic devices and a redistribution layer. Columnar electrodes (pillars), solder bumps, or the like may be formed on these mounting pads, and before mounting, an NCF (Non-Conductive Film), which is a sealing resin film, or the like may be affixed to the redistribution layer surface. The bonding is preferably performed using a low melting point metal such as solder, but an anisotropic conductive film or the like may be used. The die bonding adhesion method is a method of adhering the surfaces of electronic devices opposite to the mounting pad surfaces to a redistribution layer. For this adhesion, a paste or a film that is a resin composition comprising a thermosetting resin and a thermally conductive inorganic filler is preferably used.

EXAMPLES

The present invention will be more specifically described by the following Examples.

Example 1

Processed portions constituting alignment marks were formed on a carrier 12 as shown in FIG. 1, and then an intermediate layer 14 (a first intermediate layer 14*a* and a second intermediate layer 14*b*), a carbon layer as a release layer 16, and a metal layer 18 (a first metal layer 18*a* and a second metal layer 18*b*) were formed in this order to fabricate a carrier-attached metal foil 10. The specific procedure is as follows.

(1) Provision of Carrier

A 200 mm×250 mm, 1.1 mm thick glass sheet (material: soda lime glass) was provided as the carrier 12.

(2) Formation of Processed Portions Constituting Alignment Marks

A masking layer was formed on a surface of the carrier 12 in a pattern in which six circular processed regions (exposed portions) having a diameter of 400 μm were disposed apart from each other. The formation of this masking layer was performed by roll lamination using a photosensitive film. Next, a medium (material: green carbonite) having a particle diameter of 0.05 mm was projected from a nozzle having a discharge diameter of 0.4 mm at a discharge pressure of 0.5 MPa or more for 2 to 5 seconds onto the surface of the carrier 12 on which portions other than the circular processed regions were covered with the masking layer, using a blower blasting apparatus (manufactured by ALPS ENGINEERING, BSP-50D), so that holes having an intended depth of 200 μm were formed, to perform blasting treatment on the exposed portions of the carrier 12. Thus, six depressed portions 12*a* were formed on the surface of the carrier 12 as processed portions constituting alignment marks, to define positioning regions P. Subsequently, the masking layer was removed.

(3) Formation of First Intermediate Layer

A 100 nm thick titanium layer as the first intermediate layer 14*a* was formed on the surface (the surface on the side on which the depressed portions were formed) of the carrier 12 by sputtering with the following apparatus and conditions:

Apparatus: single-wafer magnetron sputtering apparatus (manufactured by Canon Tokki Corporation, MLS464)

Target: titanium target (purity 99.999%) having diameter of 8 inches (203.2 mm)

Ultimate vacuum: less than $1\times10^{-4}$ Pa

Carrier gas: Ar (flow rate: 100 sccm)

Sputtering pressure: 0.35 Pa

Sputtering power: 1000 W (3.1 W/cm$^2$)

Temperature during film formation: 40° C.

(4) Formation of Second Intermediate Layer

A 100 nm thick Cu layer as the second intermediate layer 14*b* was formed on the first intermediate layer 14*a* by sputtering with the following apparatus and conditions:

Apparatus: single-wafer DC sputtering apparatus (manufactured by Canon Tokki Corporation, MLS464)

Target: Cu target (purity 99.98%) having diameter of 8 inches (203.2 mm)

Ultimate vacuum: less than $1\times10^{-4}$ Pa

Gas: argon gas (flow rate: 100 sccm)

Sputtering pressure: 0.35 Pa

Sputtering power: 1000 W (6.2 W/cm$^2$)

Temperature during film formation: 40° C.

(5) Formation of Carbon Layer

A 6 nm thick amorphous carbon layer as the release layer 16 was formed on the Cu layer by sputtering with the following apparatus and conditions:

Apparatus: single-wafer DC sputtering apparatus (manufactured by Canon Tokki Corporation, MLS464)

Target: carbon target (purity 99.999%) having diameter of 8 inches (203.2 mm)

Ultimate vacuum: less than $1\times10^{-4}$ Pa

Carrier gas: Ar (flow rate: 100 sccm)

Sputtering pressure: 0.35 Pa

Sputtering power: 250 W (0.7 W/cm$^2$)

Temperature during film formation: 40° C.

(6) Formation of First Metal Layer

A 100 nm thick titanium layer as the first metal layer 18*a* was formed on the surface of the release layer 16 by sputtering with the following apparatus and conditions:

Apparatus: single-wafer DC sputtering apparatus (manufactured by Canon Tokki Corporation, MLS464)

Target: titanium target (purity 99.999%) having diameter of 8 inches (203.2 mm)

Carrier gas: Ar (flow rate: 100 sccm)

Ultimate vacuum: less than $1\times10^{-4}$ Pa

Sputtering pressure: 0.35 Pa

Sputtering power: 1000 W (3.1 W/cm$^2$)

(7) Formation of Second Metal Layer

A Cu layer having a film thickness of 300 nm as the second metal layer 18*b* was formed on the first metal layer 18*a* by sputtering with the following apparatus and conditions to obtain the carrier-attached metal foil 10.

Apparatus: single-wafer DC sputtering apparatus (manufactured by Canon Tokki Corporation, MLS464)

Target: Cu target (purity 99.98%) having diameter of 8 inches (203.2 mm)

Ultimate vacuum: less than $1\times10^{-4}$ Pa

Carrier gas: Ar (flow rate: 100 sccm)

Sputtering pressure: 0.35 Pa

Sputtering power: 1000 W (3.1 W/cm$^2$)

Temperature during film formation: 40° C.

(8) Measurement of Alignment Marks

The depressed portions 12*a* constituting the alignment marks were observed using a laser microscope (LEXT OLS3000 manufactured by Olympus Corporation). The image analysis of the observed image was performed to measure the maximum depth d of the depressed portion 12*a*, the outer diameter φ when the depressed portion 12*a* was seen in a planar view, the angle θ formed by the major surface s of the carrier 12 and the tangent t to the inner wall surface of the depressed portion 12*a*, and the radius of curvature r of the open end of the depressed portion 12*a*. For the analysis, tools mounted in the microscope and image analysis software ImageJ were used in combination. For each parameter, the average value of values measured in three circular processed regions was calculated. The results were as shown in Table 1. It is considered that the shape of the depressed portion 12*a* is substantially the same even after the various layers are laminated on the carrier (that is, even for the depressed portion forming the alignment mark).

Example 2

A carrier-attached metal foil 10 was fabricated in the same manner as Example 1 except that in the step of forming alignment marks, the conditions of the blasting treatment were appropriately changed to modify the angle θ formed by the major surface s of the carrier 12 and the tangent t to the inner wall surface of the depressed portion 12*a*, and the radius of curvature r of the open end of the depressed portion 12*a*. The measurement of the depressed portions constituting the alignment marks was also performed in the same manner as Example 1.

Examples 3 to 5

A carrier-attached metal foil 10 was fabricated in the same manner as Example 1 except that in the step of forming alignment marks, six depressed portions constituting alignment marks were formed by laser ablation treatment instead of the blasting treatment. The measurement of the depressed portions constituting the alignment marks was also performed in the same manner as Example 1. The laser ablation treatment was performed by irradiating six points on a surface of the carrier 12 spaced apart from each other with a solid-state UV laser beam under the following conditions:

[Laser Drilling Conditions]

Apparatus: laser patterning apparatus manufactured by Toray Engineering Co., Ltd.

Output: 35 mW

Wavelength: 355 nm

Intend diameter: 400 μm (Examples 3 and 4) or 2000 μm (Example 5)

Intended depth: 200 μm (Examples 3 and 5) or 100 μm (Example 4)

Evaluation

For the carrier-attached metal foils 10 of Examples 1 to 5, various evaluations were performed as shown below. The evaluation results were as shown in Table 1.

<Evaluation 1: Exposure and Development Performance>

The exposure and development performance of the carrier-attached metal foil 10 was evaluated by the following procedure. As shown in FIG. 8, a photoresist 20 was laminated on the second metal layer 18*b* of the carrier-attached metal foil 10. This carrier-attached metal foil 10 was carried into an exposure apparatus for rough circuits (manufactured by Ushio Inc., UX-5 Series). In the exposure apparatus for rough circuits, the detection of information on the pattern of the positioning regions P, and positioning, on the carrier-attached metal foil 10 were performed, and exposure was performed on the surface on the wiring region W in a pattern in which the circuit width was 100 μm. Subsequently, the carrier-attached metal foil 10 was immediately transferred from the exposure apparatus for rough circuits to an exposure apparatus for fine circuits (manufactured by Ushio Inc., UX-7 Series). In the exposure apparatus for fine circuits, the detection of information on the pattern of the positioning regions P, and positioning, on the carrier-attached metal foil 10 were performed, and exposure was performed on the surface on the wiring region W in a pattern in which the circuit width was 2 μm. Development was performed on the carrier-attached metal foil 10 under known conditions to form a resist pattern 22 composed of a rough circuit pattern 22*a* and a fine circuit pattern 22*b*. Electric copper plating was performed on the carrier-attached metal foil 10 after the resist pattern 22 formation under known conditions, and subsequently the resist pattern 22 was stripped. The unnecessary portions of the metal layer 18 exposed by the stripping of the resist pattern 22 were etched away under known conditions. Thus, rough circuits having a circuit width of 100 μm and fine circuits having a circuit width of 2 μm were formed on the carrier-attached metal foil 10. The carrier-attached metal foil 10 after the circuit formation was observed by an SEM. As a result, it was confirmed that on the carrier-attached metal foil 10 of any of Examples 1 to 5, the rough circuits and the fine circuits were formed according to the intended designs.

<Evaluation 2: Cracking Frequency of Carrier>

The cracking frequency of the carrier 12 was evaluated by the following procedure. First, five 100 mm×100 mm, 1.1 mm thick glass sheets (material: soda lime glass) were provided, and nine depressed portions constituting alignment marks were formed on them under the same conditions as Examples 1 to 5. The intended positions (central points) of the depressed portions constituting the alignment marks were points respectively represented by coordinates (25,25), (50,25), (75,25), (25,50), (50,50), (75,50), (25,75), (50,75), and (75,75) when the coordinates of one corner (end) of the glass sheet were determined as the reference point (0,0), and the coordinates of the diagonally located corner were set at (100,100). Then, the ring bending test for glass in accordance with standard number: ASTM C1499-01 was carried out on the glass sheets on which the depressed portions constituting the alignment marks were formed, and a glass sheet (100 mm×100 mm, thickness 1.1 mm, material: soda lime glass) on which depressed portions constituting alignment marks were not formed, as an object to be compared. The ratios of the surface strength of the glass sheets on which the depressed portions constituting the alignment marks were formed to the surface strength of the glass sheet on which depressed portions constituting alignment marks were not formed were calculated and rated by the following criteria:

Evaluation A: the ratio of surface strength is 0.9 or more

Evaluation B: the ratio of surface strength is 0.7 or more and less than 0.9

Evaluation C: the ratio of surface strength is less than 0.7

<Evaluation 3: Visibility of Alignment Marks>

The visibility of the alignment marks was evaluated by the following procedure. Nine depressed portions constituting alignment marks were formed on five glass sheets under the same conditions as Examples 1 to 5, as in Evaluation 2, and then an intermediate layer 14 (a first intermediate layer 14*a* and a second intermediate layer 14*b*), a carbon layer as a release layer 16, and a metal layer 18 (a first metal layer 18*a* and a second metal layer 18*b*) were formed in this order under the conditions of Example 1 to fabricate carrier-attached metal foils 10. Subsequently, the formed alignment marks were repeatedly recognized 10 times using the above exposure apparatus, to measure the dimensional errors of the central points of the alignment marks. Then, the average value of the dimensional errors was calculated and rated by the following criteria:

Evaluation A: the average value of the dimensional errors is less than ±50 μm

Evaluation B: the average value of the dimensional errors is ±50 μm or more and less than ±150 μm Evaluation C: the average value of the dimensional errors is ±150 μm or more <Evaluation 4: Processing Soil>

Processing soil was evaluated by the following procedure. Nine depressed portions constituting alignment marks were formed on five glass sheets under the same conditions as Examples 1 to 5, as in Evaluation 2, and then the surroundings of the depressed portions constituting the alignment marks were observed by a laser microscope (maximum field of view: 5 mm×5 mm). The extent of the spread of discoloration observed in the surroundings of the depressed portions was rated by the following criteria:

Evaluation A: There is no discoloration at the peripheries of the depressed portions, or there is discoloration at the peripheries of the depressed portions, but the discoloration is within the range of less than 5 μm from the outer edges of the depressed portions.

Evaluation B: There is discoloration at the peripheries of the depressed portions, but the discoloration is within the range of 100 μm or less from the outer edges of the depressed portions.

Evaluation C: There is discoloration at the peripheries of the depressed portions, and the discoloration extends to the range of more than 100 μm from the outer edges of the depressed portions.

TABLE 1

| | For-mation method | Depressed portions constituting alignment marks | | | | Evaluation | | | |
| | | Maximum depth d [μm] | Outer diameter φ [μm] | Angle θ | Radius of curvature r [μm] | Rough circuit width R/ Fine circuit width F (R/F) | Cracking frequency of carrier | Visibility of alignment marks | Processing soil |
|---|---|---|---|---|---|---|---|---|---|
| Ex. 1 | Blasting | 198 | 401 | 82° | 18 | 100 μm/2 μm (50) | A | A | A |
| Ex. 2 | Blasting | 197 | 405 | 550 | 40 | 100 μm/2 μm (50) | A | B | A |
| Ex. 3 | Laser ablation | 198 | 407 | 81° | 32 | 100 μm/2 μm (50) | A | A | B |
| Ex. 4 | Laser ablation | 100 | 415 | 66° | 37 | 100 μm/2 μm (50) | A | B | B |
| Ex. 5 | Laser ablation | 197 | 2000 | 63° | 86 | 100 μm/2 μm (50) | B | B | B |

Maximum depth d: the maximum depth of the depressed portion constituting the alignment mark
Outer diameter φ: the outer diameter when the depressed portion constituting the alignment mark is seen in a planar view
Angle θ: the angle formed by the major surface of the carrier and the tangent to the inner wall surface of the depressed portion
Radius of curvature r: the radius of curvature of the open end of the depressed portion

The invention claimed is:

1. A carrier-attached metal foil comprising a carrier, a release layer provided on at least one surface of the carrier, and a metal layer provided on the release layer, wherein the carrier-attached metal foil comprises:

a wiring region throughout which the carrier, the release layer, and the metal layer are present; and at least two positioning regions provided on the at least one surface of the carrier-attached metal foil, wherein the at least two positioning regions are defined by depressed portions recessed into and integral with the carrier, thereby forming alignment marks used for positioning in wiring formation involving exposure and development.

2. The carrier-attached metal foil according to claim 1, wherein the alignment marks have at least one shape selected from the group consisting of a circle, a cross, and polygons.

3. The carrier-attached metal foil according to claim 1, wherein each of the depressed portions has a maximum depth of 0.1 μm or more and 1000 μm or less.

4. The carrier-attached metal foil according to claim 1, wherein each of the depressed portions has a planar view shape of a circle having an outer diameter of 50 μm or more and 5000 μm or less.

5. The carrier-attached metal foil according to claim 1, wherein an angle formed by a major surface of the carrier and a tangent to an inner wall surface of each of the depressed portions is 40° or more.

6. The carrier-attached metal foil according to claim 1, wherein each of the depressed portions has a round open end, and the round open end has a radius of curvature of 100 μm or less.

7. The carrier-attached metal foil according to claim 1, having 200 or less of the alignment marks.

8. The carrier-attached metal foil according to claim 1, wherein the carrier is composed of glass or ceramic.

9. A method for forming wiring through exposure and development using the carrier-attached metal foil according to claim 1, comprising performing positioning based on the positioning regions of the carrier-attached metal foil prior to exposure, wherein exposures for circuits having different circuit widths are separately performed, and development for the circuits is simultaneously performed.

10. The method according to claim 9, the method for forming wiring being a method for forming a redistribution layer, wherein the circuits has a fine circuit having a circuit width of 0.1 μm or more and 5 μm or less, and a rough circuit having a circuit width of greater than 5 μm and 500 μm or less.

11. The method according to claim 10, wherein R/F representing a ratio of a maximum circuit width of the rough circuit, R, to a minimum circuit width of the fine circuit, F, is 2.0 or more and 500 or less.

12. A method for manufacturing the carrier-attached metal foil according to claim 1, comprising:

providing a carrier;

processing predetermined regions of at least one surface of the carrier to form at least two processed portions constituting the alignment marks, thereby defining the at least two positioning regions; and forming the release layer and the metal layer in sequence on the at least one surface of the carrier.

13. The method according to claim 12, wherein formation of the alignment marks is performed using at least one method selected from an etching method, a blasting method, and a laser ablation method.

*   *   *   *   *